(12) United States Patent
Wang et al.

(10) Patent No.: US 12,342,461 B2
(45) Date of Patent: Jun. 24, 2025

(54) MEMORY MODULE CONNECTION INTERFACE FOR POWER DELIVERY

(71) Applicant: DELL PRODUCTS L.P., Round Rock, TX (US)

(72) Inventors: Isaac Q. Wang, Austin, TX (US); Jordan Chin, Austin, TX (US); James L. Petivan, III, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 376 days.

(21) Appl. No.: 17/854,495

(22) Filed: Jun. 30, 2022

(65) Prior Publication Data

US 2024/0008181 A1    Jan. 4, 2024

(51) Int. Cl.
*H05K 1/14*   (2006.01)
*H05K 1/11*   (2006.01)

(52) U.S. Cl.
CPC ............ *H05K 1/141* (2013.01); *H05K 1/111* (2013.01); *H05K 2201/10325* (2013.01); *H05K 2201/10446* (2013.01)

(58) Field of Classification Search
CPC .................. H05K 1/111; H05K 1/141; H05K 2201/10325; H05K 2201/10446
USPC ...................................... 439/59–64, 630–637
See application file for complete search history.

(56) References Cited

U.S. PATENT DOCUMENTS

| | | | |
|---|---|---|---|
| 5,919,049 A * | 7/1999 | Petersen | H01R 12/721 439/60 |
| 8,199,515 B2 | 6/2012 | Bandholz et al. | |
| 9,298,228 B1 | 3/2016 | Abhyankar et al. | |
| 11,258,195 B2 * | 2/2022 | Kimura | H05K 1/117 |
| 11,757,222 B1 * | 9/2023 | Mann | H01R 12/716 439/709 |
| 2008/0085624 A1 | 4/2008 | Gange et al. | |

* cited by examiner

*Primary Examiner* — Phuong K Dinh
(74) *Attorney, Agent, or Firm* — Larson Newman, LLP

(57) ABSTRACT

An interface apparatus for installing an add-in module to an information handling system includes the add-in module and an add-in module socket. The add-in module includes a card-edge connector on a first edge of the add-in module, and an electrical contact finger on a second edge of the add-in module. The add-in module socket is affixed to the information handling system and receives the add-in module. The add-in module socket includes a card-edge connector interface for receiving the card edge connector, and a slot channel for receiving the second edge of the add-in module. The slot channel includes an electrical contact pad configured such that, when the add-in module is installed into the add-in module socket, a current is provided between the add-in module socket and the add-in module through the electrical contact pad and the electrical contact finger.

19 Claims, 4 Drawing Sheets

MEMORY MODULE CONNECTION INTERFACE FOR POWER DELIVERY

FIELD OF THE DISCLOSURE

This disclosure generally relates to information handling systems, and more particularly relates to providing an improved memory module connection interface for power delivery.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

SUMMARY

An interface apparatus for installing an add-in module to an information handling system may include the add-in module and an add-in module socket. The add-in module may include a card-edge connector on a first edge of the add-in module, and an electrical contact finger on a second edge of the add-in module. The add-in module socket may be affixed to the information handling system and may receive the add-in module. The add-in module socket may include a card-edge connector interface for receiving the card edge connector, and a slot channel for receiving the second edge of the add-in module. The slot channel may include an electrical contact pad configured such that, when the add-in module is installed into the add-in module socket, a current is provided between the add-in module socket and the add-in module through the electrical contact pad and the electrical contact finger.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings. However, other teachings can certainly be used in this application. The teachings can also be used in other applications, and with several different types of architectures, such as distributed computing architectures, client/server architectures, or middleware server architectures and associated resources.

Figure 1:
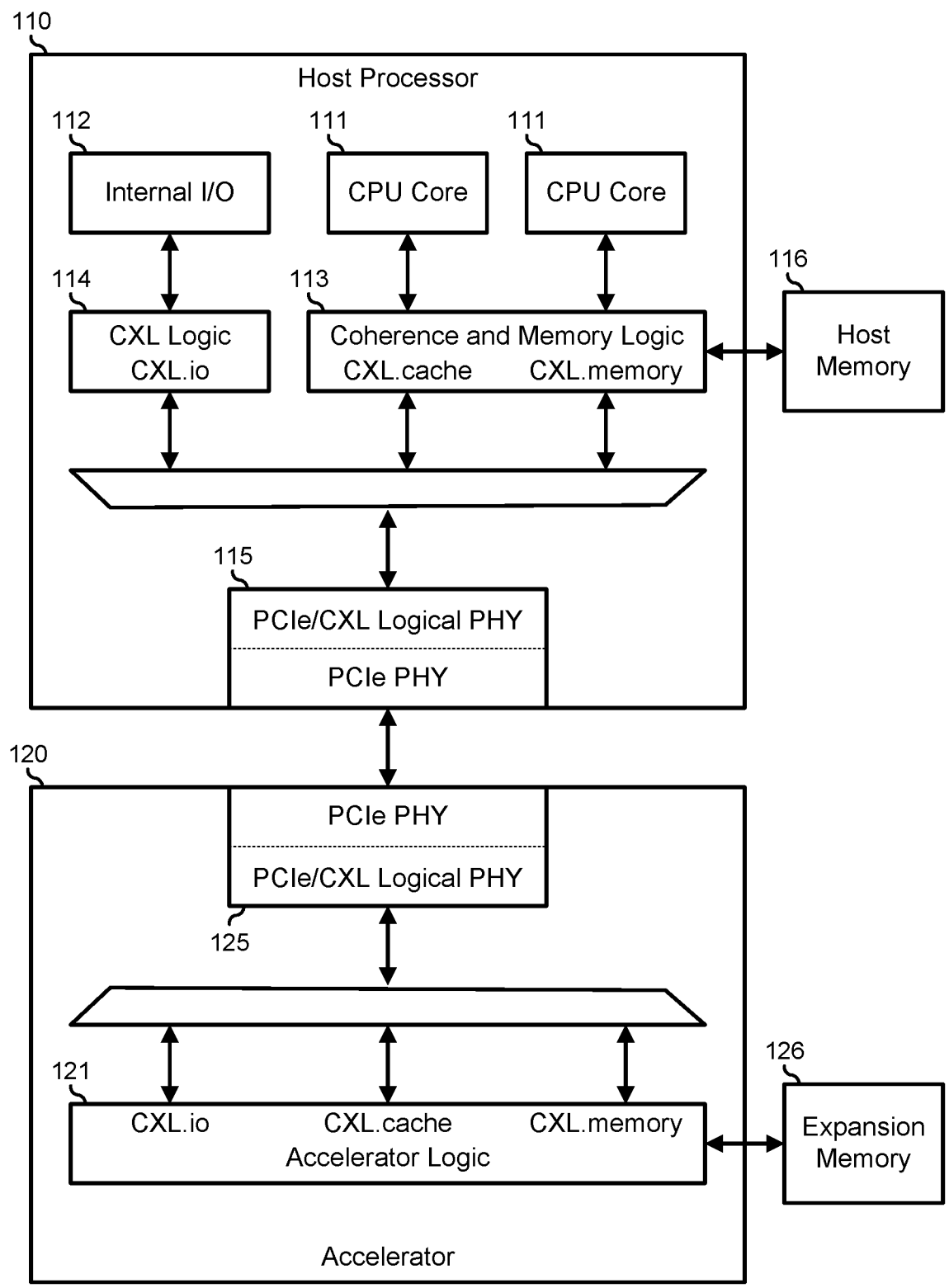
FIG. 1 is a block diagram of an information handling system according to an embodiment of the current disclosure.

FIG. 1 shows an information handling system 100, including a host processor 110 with associated host memory 116, and an accelerator device 120 with associated expansion memory 126. Host processor 110 includes one or more processor core 111, various internal input/output (I/O) devices 112, coherence and memory logic 113, Compute Express Link (CXL) logic 114, and a PCIe physical layer (PHY) interface 115. Coherence and memory logic 113 provides cache coherent access to host memory 116. The operation of a host processor, and particularly of the component functional blocks within a host processor, are known in the art, and will not be further described herein, except as needed to illustrate the current embodiments.

Accelerator device 120 includes accelerator logic 121, and a PCIe PHY interface 125 that is connected to PCIe PHY interface 115. Accelerator logic 121 provides access to expansion memory 126. Accelerator device 120 represents a hardware device configured to enhance the overall performance of information handling system 100. An examples of accelerator device 120 may include a smart Network Interface Card (NIC) or Host Bus Adapter (HBA), a Graphics Processing Unit (GPU), Field Programmable Gate Array (FPGA), or Application Specific Integrated Circuit (ASIC) device, a memory management and expansion device or the like, or another type of device configured to improve the performance of information handling system 100, as needed or desired. In particular, being coupled to host processor 110 via the PCIe link established between PCIe interfaces 115 and 125, accelerator device 120 may represent a task-based device that receives setup instructions from the host processor, and then independently executes the tasks specified by the setup instructions. In such cases, accelerator device 120 may access host memory 116 via a Direct Memory Access (DMA) device or DMA function instantiated on the host processor. When representing a memory management device, accelerator device 120 may represent a device configured to provide an expanded memory capacity, in the form of expansion memory 126, thereby increasing the overall storage capacity of information handling system 100, or may represent a memory capacity configured to increase the memory bandwidth of the information handling system, as needed or desired.

Information handling system 100 represents an information handling system configured in conformance with a Compute Express Link (CXL) standard, such as a CXL 1.1 specification, a CXL 2.0 specification, or any other CXL standard as may be published from time to time by the CXL Consortium. The CXL standard is an industry-supported interconnection standard that provides a cache-coherent interconnection between processors, accelerator devices, memory expansion devices, or other devices, as needed or desired. In this way, operations performed at diverse locations and by diverse architectures may maintain a memory coherency domain across the entire platform. The CXL standard provides for three (3) related protocols: CXL.io, CXL.cache, and CXL.memory. The CXL.io protocol represents an I/O protocol that is based upon the PCIe 5.0 protocol (for CXL specification 1.1) or the PCIe 6.0 protocol (for CXL specification 2.0).

For example, the CXL.io protocol provides for device discovery, configuration, and initialization, interrupt and DMA handling, and I/O virtualization functions, as needed or desired. The CXL.cache protocol provides for processors to maintain a cache-coherency domain with accelerator devices and their attached expansion memory, and with capacity- and bandwidth-based memory expansion devices, as needed or desired. The CXL.memory protocol permits processors and the like to access memory expansion devices in a cache-coherency domain utilizing load/store-based commands, as needed or desired. Further, the CXL.memory protocol permits the use of a wider array of memory types than may be supported by processor 110. For example, a processor may not provide native support for various types of non-volatile memory devices, such as Intel Optane Persistent Memory, but the targeted installation of an accelerator device that supports Intel Optane Persistent Memory may permit the information handling system to utilize such memory devices, as needed or desired.

In this regard, host processor 110 and accelerator device 120 each include logic and firmware configured to instantiate the CXL.io, CXL.cache, and CXL.memory protocols. In particular, within host processor 110, coherence and memory logic 113 instantiates the functions and features of the CXL.cache and CXL.memory protocols, and CXL logic 114 implements the functions and features of the CXL.io protocol. Further, PCIe PHY 115 instantiates a virtual CXL logical PHY. Likewise, within accelerator device 120, accelerator logic 121 instantiates the CXL.io, CXL.cache, and CXL.memory protocols, and PCIe PHY 125 instantiates a virtual CXL logical PHY. Within a CXL enabled accelerator device such as accelerator device 120, both the CXL.cache and CXL.memory protocols do not have to be instantiated, as needed or desired, but any CXL enabled accelerator device must instantiate the CXL.io protocol.

Figure 2:
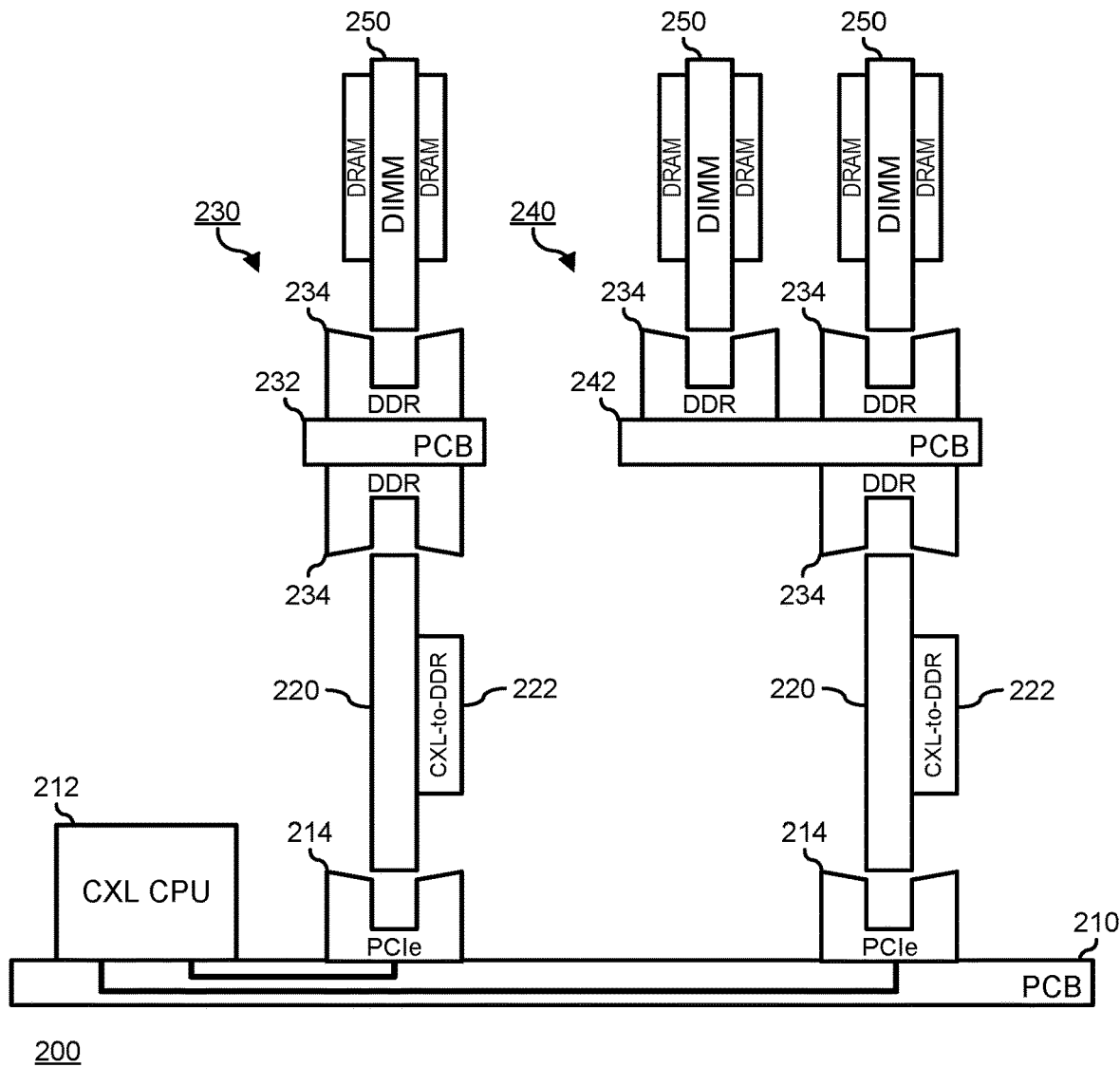
FIG. 2 is a block diagram of an information handling system according to an embodiment of the current disclosure.
Figure 2:
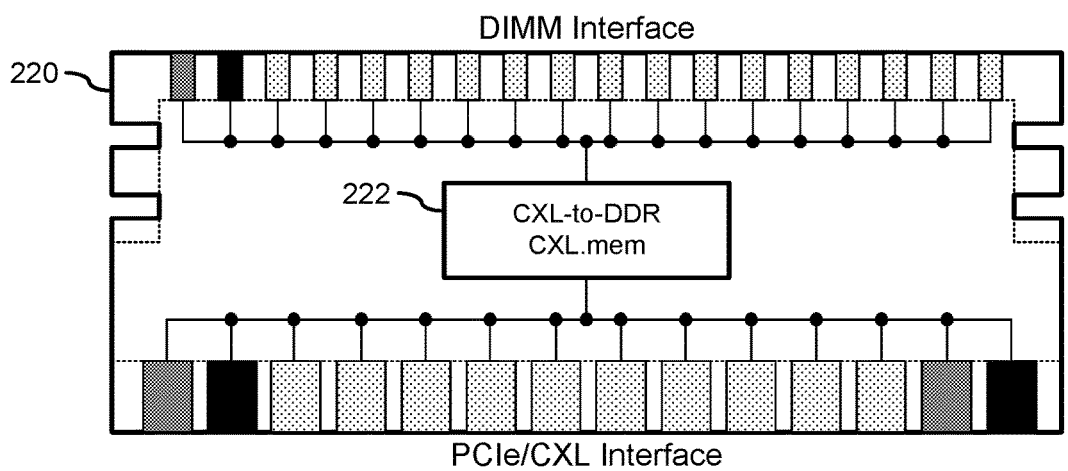

FIG. 2 illustrates an information handling system 200 similar to information handling system 100. Information handling system 200 includes a printed circuit board (PCB) 210, two (2) CXL memory riser cards 220, a single-Dual In-Line Memory Module (DIMM) memory riser adapter 230 populated with one (1) DIMM 250, and a double-DIMM memory rise adapter 240 populated with two (2) DIMMs. PCB 210 includes a CXL processor 212 similar to host processor 110. As such, CXL CPU 212 instantiates the CXL.io, CXL.cache, and CXL.memory protocols, and will be understood to include two (2) PCIe PHY interfaces that each support virtual CXL logical PHY interfaces. The first PCIe PHY is connected to a first PCIe x16 connector socket 214, and the second PCIe PHY is connected to a second PCIe x16 connector socket 214. In other embodiments a PCIe PHY may represent a narrower interface, such as a x8 interface, a x4 interface, x2 interface, a x1 interface, or another width of PCIe interface, as needed or desired.

CXL memory riser cards 220 represent memory expansion type accelerator devices similar to accelerator device 120. CXL memory riser cards 220 are shown in an exploded-view form, but will be understood to be inserted at a bottom edge of the riser cards into PCIe connectors 214 in operation. As such, as illustrated in the bottom portion of FIG. 2, CXL memory riser cards 220 include a CXL-to-Double Data Rate (DDR) device 222 configured to receive commands and data on a PCIe x16 card-edge connector at the bottom edge of the riser card, and to translate the commands and data into DDR-based transactions on a DDR card-edge connector at the top edge of the riser card. CXL-to-DDR device 222 instantiates at least the CXL.io and CXL.memory protocols, and may further instantiate the CXL.cache protocol, as needed or desired. CXL-to-DDR device 222 will be understood to support only a single particular generation of DDR memory. For example, CXL-to-DDR device 222 may be understood to support one of the third generation DDR (DDR3), the fourth generation DDR (DDR4), the fifth generation (DDR5), or future DDR generations (for example DDR6), but will not be understood to support more than one generation due to incompatibilities in the connector pin-outs between the DDR generations. The illustrated depictions of the PCIe x16 card edge connector and the DDR card edge connector in the bottom portion of FIG. 2 are simplified representations of the respective connectors for the sake of illustration.

CXL memory riser adapter 230 includes a PCB 232 and two (2) DDR connector sockets 234. A first one of DDR connector sockets 234 is affixed to a bottom surface of PCB 232, and a second one of the DDR connector sockets 234 is affixed to a top surface of the PCB. Similarly, CXL memory riser adapter 240 includes a PCB 242 and three (3) DDR connector sockets 234. A first one of DDR connector sockets 234 is affixed to a bottom surface of PCB 242, and the second and third DDR connector sockets 234 are affixed to a top surface of the PCB. CXL memory riser adapters 230 and 240 are shown in an exploded-view form, but it should be understood that the DDR card-edge connector at the top edge of CXL memory riser cards 220 will be inserted into the bottom DDR connector sockets 234 in operation. Likewise DIMMs 250 are illustrated in an exploded-view form, but it should be understood that the DIMMs will be inserted into the top DDR connector sockets 234 in operation. DDR connector sockets 234 and DIMMS 250 will be understood to be provided in harmony with the generation of DDR memory that is supported by CXL-to-DDR device 222, as described above. In a particular embodiment, CXL memory riser adapter 230 may be understood to provide information handling system 200 with enhanced memory storage capacity, and with greater memory bandwidth, as needed or desired. Further, while CXL memory riser adapter 240 may provide greater memory bandwidth, a particular usage of CXL memory riser adapter 240 may be understood to provide information handling system 100 with increased memory storage capacity.

The use of the DDR card-edge connector at the top of CXL memory riser card 220, and of DDR connector socket 234 on the bottom sides of CXL memory riser adapters 230 and 240 are not the conventional usages for DDR card-edge connectors and DDR connector sockets. In particular, where a particular contact finger is traditionally an input to a card-edge connector on a DDR DIMM (for example COMMAND inputs), the similar contact finger on CXL memory riser card 220 will be understood to be outputs, and vice versa. As such, the top- and bottom-side DDR connector sockets 234 of CXL memory riser cards 230 and 240 may need to be crossed in order to maintain compatibility with the associated DDR generation instantiated by CXL-to-DDR device 222, as needed or desired. In a first embodiment, such a crossover function is provided on CXL memory riser card 220, and PCBs 232 and 242 provide a simple pin-to-pin connection between the top- and bottom-side DDR connector sockets, as needed or desired. In another embodiment, PCBs 232 and 242 include multiple layers and instantiate the crossover function between the top- and bottom-side connector sockets.

In the case of DDR5 connector sockets and DDR5 DIMMs, the interface includes three (3) bulk power (VIN) contacts and multiple ground contacts. However, there may be cases where three (3) power contacts may provide insufficient current capacity for the circuits included on the associated DIMM. For example, future large capacity Dynamic Random Access Memory (DRAM) devices may necessitate a higher current capacity than is provided by the three (3) power contacts. In another example, CXL memory riser adapter 240 supports two (2) DIMMs 250, but the DDR card-edge connector on the top edge of CXL memory riser card 220 would only provide the typical three (3) power contacts for DDR5 DIMMs. As such, the use of typical DDR connector sockets may not provide sufficient current capacity for current and future power demands of the DIMMs that utilize them.

Figure 3:
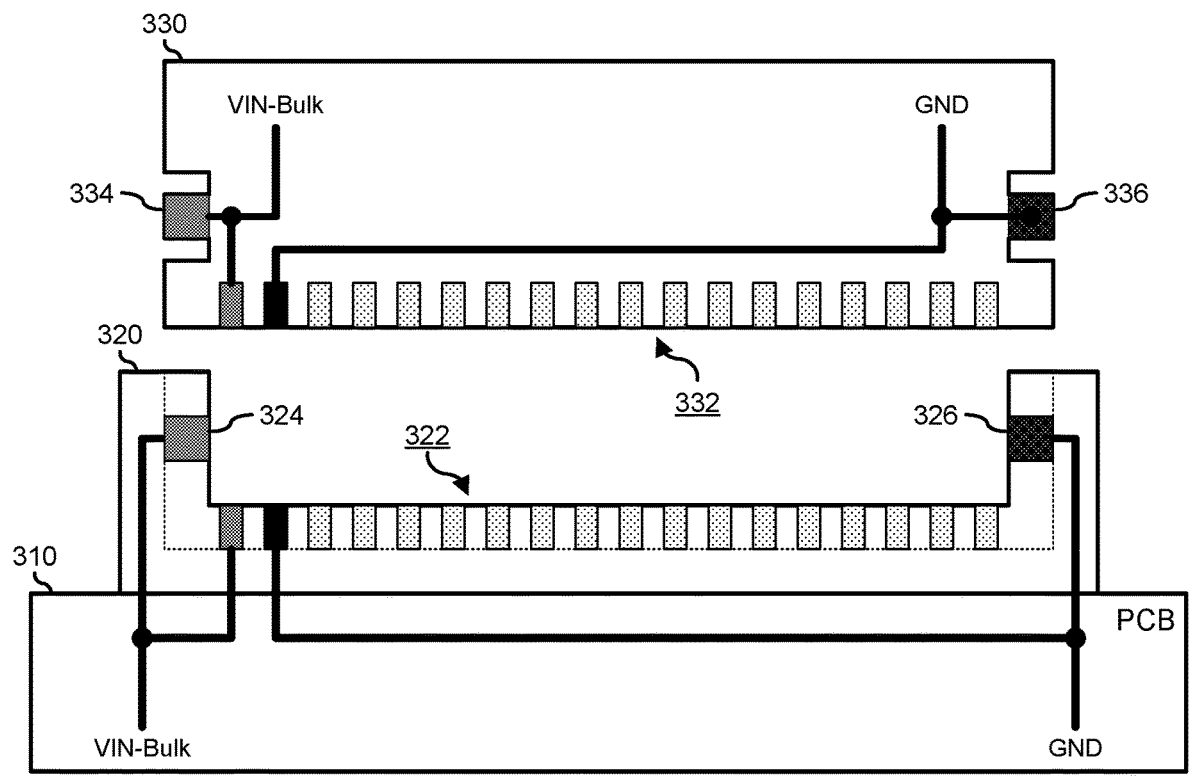
FIG. 3 is a diagram of a DDR interface.
Figure 3:
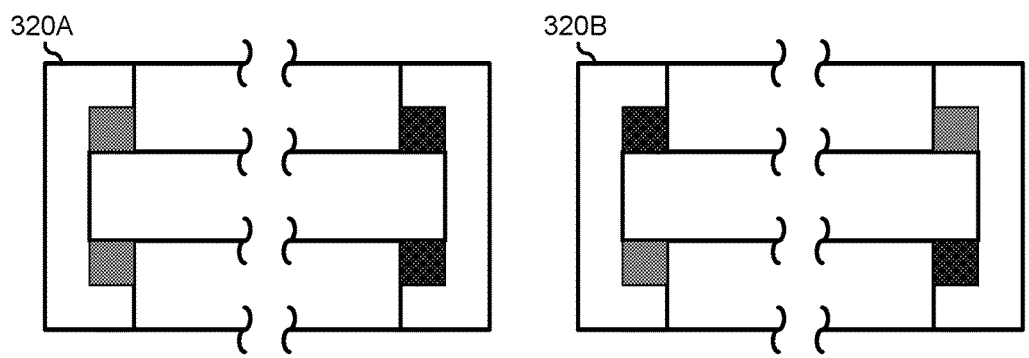

FIG. 3 illustrates a simplified depiction of a DDR interface 300, including a PCB 310, a DDR connector socket 320, and a DDR card-edge connector 330. DDR interface 300 may represent a typical DDR interface for the insertion of a DDR DIMM into the DDR connector socket, or may represent one of several DDR interfaces for a CXL memory riser card/CXL memory riser adapter pair as illustrated in FIG. 2. DDR connector socket 320 is affixed to PCB 310, and electrically connected to circuit, power, and ground traces instantiated within the PCB as needed or desired.

DDR connector socket 320 includes a contact array 322, a power contact 324, and a ground contact 326. Contact array 322 is illustrated as including at least one (1) power contact (the dark shaded contact), and at least one ground contact (the black contacts). As such, DDR connector socket 320 may represent a DDR5 connector or another generation of DDR connector socket as needed or desired. Power contact 324 and ground contact 326 are located within slot channels of DDR connector socket 320. Various arrangements of power contacts and ground contacts are depicted in a bottom portion of FIG. 3. For example, a top view of DDR connector socket 320A illustrates where two (2) power contacts are located one each side of a first slot channel of the DDR connector socket and where two (2) ground contacts are located on each side of a second slot channel. In another example, a top view of DDR connector socket 320B illustrates where a single (1) power contact and a single (1) ground contact are located on respective sides of a first slot channel of the DDR connector socket, and where a second single (1) power contact and a second single (1) ground contact are located on respective sides of a second slot channel. Note that another embodiment may include where only power contacts are provided in the slot channels. Here, ground pins within the contact array may be sufficient to carry the return current from the DIMM, as needed or desired.

DDR card-edge connector 330 includes a contact array 332, a power contact 334, and a ground contacts 336. Contact array 332 is illustrated as including at least one (1) power contact (the dark shaded contacts), and at least one (1) ground contact (the black contacts). As such, DDR card-edge connector 330 may represent a DDR5 card-edge connector or another generation of card-edge connectors as needed or desired. Power contact 334 and ground contact 336 are located on a first side of a PCB of DDR card-edge connector 330. It will be understood that a second side of the PCB of DDR card edge connector 330 may include additional power contacts 334 and ground contacts 336, as needed or desired.

Within DDR connector socket 320, power contacts 324 and ground contacts 326 may utilize spring-latched contacts or other types of contacts to ensure sound electrical contact between DDR connector socket and DDR card-edge connector 330, as needed or desired. In considering the attachment of DDR connector socket 320 to PCB 310, additional power and ground contact points may be provided on the PCB to connect respective power contacts 324 and ground contacts 326 to the power and ground planes of the PCB, as needed or desired, in addition to the contact points provided for the power and ground contacts of contact array 322. In a first embodiment, where DDR connector socket 320 is a Surface Mount Technology (SMD) socket, the addition contact points may include additional power and ground pads on the surface of PCB 310 that are soldered to respective power and ground contacts on DDR connector socket 320 that are connected to respective power contacts 324 and ground contacts 326, as needed or desired. In a second embodiment, where DDR connector socket 320 is a Plated Through Hole (PTH) socket, the addition contact points may include additional power and ground through-hole vias through PCB 310 that receive respective power and ground pins on DDR connector socket 320 that are connected to respective power contacts 324 and ground contacts 326, as needed or desired.

The use of power and ground contacts in the slot channels of DDR connector sockets and the associated DDR card-edge connectors as illustrated in FIG. 3, may obviate the need for separate power and ground contacts within the associated contact arrays in future generations of DDR devices, thereby freeing up contacts within the arrays for additional signaling, as needed or desired. Further, the current capacities of power and ground contacts within socket slot channels and on card-edge connector surfaces may be increased or decreased in proportion with the sizes of the contact areas, as needed or desired. In particular, where power and ground contacts are removed from the contact arrays, larger power and ground contacts within the socket slot channels and on the card-edge connector surfaces may be sufficient to handle the total current needs of the future generation DDR devices, as needed or desired. Moreover, it will be understood that the use of power and ground contacts in the slot channels of various types connector sockets and the associated card-edge connectors need not be limited to DDR devices, but power and ground contacts may be provided in the slot channels of various types connector sockets and the associated card-edge connectors, as needed or desired. For example, power and ground contacts in the slot channels of connector sockets and the associated card-edge connectors of PCIe devices may be provided and utilized as needed or desired.

Figure 4:
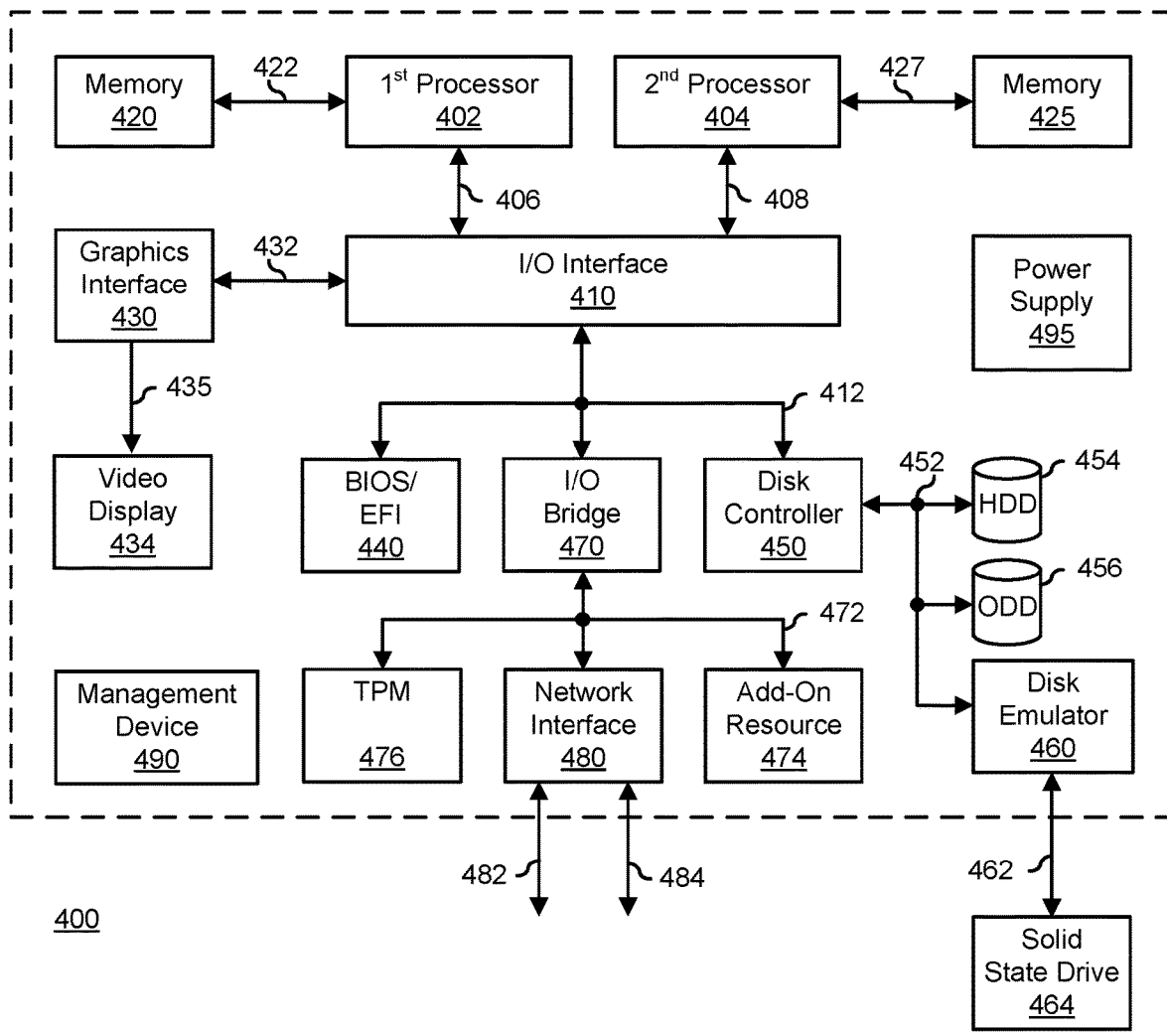
FIG. 4 is a block diagram illustrating a generalized information handling system according to another embodiment of the present disclosure.

FIG. 4 illustrates a generalized embodiment of an information handling system 400. For purpose of this disclosure an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 400 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 400 can include processing resources for executing machine-executable code, such as a central processing unit (CPU), a programmable logic array (PLA), an embedded device such as a System-on-a-Chip (SoC), or other control logic hardware. Information handling system 400 can also include one or more computer-readable medium for storing machine-executable code, such as software or data. Additional components of information handling system 400 can include one or more storage devices that can store machine-executable code, one or more communications ports for communicating with external devices, and various input and output (I/O) devices, such as a keyboard, a mouse, and a video display. Information handling system 400 can also include one or more buses operable to transmit information between the various hardware components.

Information handling system 400 can include devices or modules that embody one or more of the devices or modules described below, and operates to perform one or more of the methods described below. Information handling system 400 includes processors 402 and 404, an input/output (I/O) interface 410, memories 420 and 425, a graphics interface 430, a basic input and output system/universal extensible firmware interface (BIOS/UEFI) module 440, a disk controller 450, a hard disk drive (HDD) 454, an optical disk drive (ODD) 456, a disk emulator 460 connected to an external solid state drive (SSD) 462, an I/O bridge 470, one or more add-on resources 474, a trusted platform module (TPM) 476, a network interface 480, a management device 490, and a power supply 495. Processors 402 and 404, I/O interface 410, memory 420 and 425, graphics interface 430, BIOS/UEFI module 440, disk controller 450, HDD 454, ODD 456, disk emulator 460, SSD 462, I/O bridge 470, add-on resources 474, TPM 476, and network interface 480 operate together to provide a host environment of information handling system 400 that operates to provide the data processing functionality of the information handling system. The host environment operates to execute machine-executable code, including platform BIOS/UEFI code, device firmware, operating system code, applications, programs, and the like, to perform the data processing tasks associated with information handling system 400.

In the host environment, processor 402 is connected to I/O interface 410 via processor interface 406, and processor 404 is connected to the I/O interface via processor interface 408. Memory 420 is connected to processor 402 via a memory interface 422. Memory 425 is connected to processor 404 via a memory interface 427. Graphics interface 430 is connected to I/O interface 410 via a graphics interface 432, and provides a video display output 435 to a video display 434. In a particular embodiment, information handling system 400 includes separate memories that are dedicated to each of processors 402 and 404 via separate memory interfaces. An example of memories 420 and 425 include random access memory (RAM) such as static RAM (SRAM), dynamic RAM (DRAM), non-volatile RAM (NV-RAM), or the like, read only memory (ROM), another type of memory, or a combination thereof.

BIOS/UEFI module 440, disk controller 450, and I/O bridge 470 are connected to I/O interface 410 via an I/O channel 412. An example of I/O channel 412 includes a Peripheral Component Interconnect (PCI) interface, a PCI-Extended (PCI-X) interface, a high-speed PCI-Express (PCIe) interface, another industry standard or proprietary communication interface, or a combination thereof. I/O interface 410 can also include one or more other I/O interfaces, including an Industry Standard Architecture (ISA) interface, a Small Computer Serial Interface (SCSI) interface, an Inter-Integrated Circuit (I$^2$C) interface, a System Packet Interface (SPI), a Universal Serial Bus (USB) interface, another interface, or a combination thereof. BIOS/UEFI module 440 includes BIOS/UEFI code operable to detect resources within information handling system 400, to provide drivers for the resources, initialize the resources, and access the resources.

Disk controller 450 includes a disk interface 452 that connects the disk controller to HDD 454, to ODD 456, and to disk emulator 460. An example of disk interface 452 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 460 permits SSD 464 to be connected to information handling system 400 via an external interface 462. An example of external interface 462 includes a USB interface, an IEEE 1394 (Firewire) interface, a proprietary interface, or a combination thereof. Alternatively, solid-state drive 464 can be disposed within information handling system 400.

I/O bridge 470 includes a peripheral interface 472 that connects the I/O bridge to add-on resource 474, to TPM 476, and to network interface 480. Peripheral interface 472 can be the same type of interface as I/O channel 412, or can be a different type of interface. As such, I/O bridge 470 extends the capacity of I/O channel 412 when peripheral interface 472 and the I/O channel are of the same type, and the I/O bridge translates information from a format suitable to the I/O channel to a format suitable to the peripheral channel 472 when they are of a different type. Add-on resource 474 can include a data storage system, an additional graphics interface, a network interface card (NIC), a sound/video processing card, another add-on resource, or a combination thereof. Add-on resource 474 can be on a main circuit board, on a separate circuit board or add-in card disposed within information handling system 400, a device that is external to the information handling system, or a combination thereof.

Network interface 480 represents a NIC disposed within information handling system 400, on a main circuit board of the information handling system, integrated onto another component such as I/O interface 410, in another suitable location, or a combination thereof. Network interface device 480 includes network channels 482 and 484 that provide interfaces to devices that are external to information handling system 400. In a particular embodiment, network channels 482 and 484 are of a different type than peripheral channel 472 and network interface 480 translates information from a format suitable to the peripheral channel to a format suitable to external devices. An example of network channels 482 and 484 includes InfiniBand channels, Fibre Channel channels, Gigabit Ethernet channels, proprietary channel architectures, or a combination thereof. Network channels 482 and 484 can be connected to external network resources (not illustrated). The network resource can include another information handling system, a data storage system, another network, a grid management system, another suitable resource, or a combination thereof.

Management device 490 represents one or more processing devices, such as a dedicated baseboard management controller (BMC) System-on-a-Chip (SoC) device, one or more associated memory devices, one or more network interface devices, a complex programmable logic device (CPLD), and the like, that operate together to provide the management environment for information handling system 400. In particular, management device 490 is connected to various components of the host environment via various internal communication interfaces, such as a Low Pin Count (LPC) interface, an Inter-Integrated-Circuit (I2C) interface, a PCIe interface, or the like, to provide an out-of-band (OOB) mechanism to retrieve information related to the operation of the host environment, to provide BIOS/UEFI or system firmware updates, to manage non-processing components of information handling system 400, such as system cooling fans and power supplies. Management device 490 can include a network connection to an external management system, and the management device can communicate with the management system to report status information for information handling system 400, to receive BIOS/UEFI or system firmware updates, or to perform other task for managing and controlling the operation of information handling system 400. Management device 490 can operate off of a separate power plane from the components of the host environment so that the management device receives power to manage information handling system 400 when the information handling system is otherwise shut down. An example of management device 490 may include a commercially available BMC product or other device that operates in accordance with an Intelligent Platform Management Initiative (IPMI) specification, a Web Services Management (WSMan) interface, a Redfish Application Programming Interface (API), another Distributed Management Task Force (DMTF), or other management standard, and can include an Integrated Dell Remote Access Controller (iDRAC), an Embedded Controller (EC), or the like. Management device 490 may further include associated memory devices, logic devices, security devices, or the like, as needed or desired.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An interface apparatus for installing a card edge connector to an information handling system, the apparatus comprising:

a card edge connector socket affixed to the information handling system and configured to receive the card edge connector;

the card edge connector including a contact array on a first edge of the card edge connector, and a first electrical contact on a second edge of the card edge connector, the first edge being perpendicular to the second edge; and the card edge connector socket including a card-edge connector interface for receiving the card edge connector, and a first slot channel for receiving the second edge of the card edge connector, the first slot channel including a second electrical contact configured such that, when the card edge connector is installed into the card edge connector socket, a first current is provided between the card edge connector socket and the card edge connector through the first electrical contact and the second electrical contact.

2. The apparatus of claim 1, wherein the first electrical contact is on a first surface of the card edge connector and the second electrical contact is on a first surface of the first slot channel, such that, when the card edge connector is installed into the card edge connector socket, the first surface of the card edge connector is adjacent to the first surface of the card edge connector socket.

3. The apparatus of claim 2, wherein the card edge connector further includes a third electrical contact, and wherein the card edge connector socket further includes a fourth electrical contact configured such that, when the card edge connector is installed into the card edge connector socket, a second current is provided between the card edge connector socket and the card edge connector through the third electrical contact and the fourth electrical contact.

4. The apparatus of claim 3, wherein the third electrical contact finger is on the second edge of the card edge connector and on a second surface of the card edge connector, wherein the fourth electrical contact is on a second surface of the first slot channel, such that, when the card edge connector is installed into the card edge connector socket, the second surface of the card edge connector is adjacent to the second surface of the card edge connector socket.

5. The apparatus of claim 3, wherein the third electrical contact is on a third edge of the card edge connector, and wherein the fourth electrical contact is included in a second slot channel of the card edge connector socket, the second slot channel for receiving the third edge of the card edge connector.

6. The apparatus of claim 3, wherein the first current is a power current to provide power to the card edge connector, and wherein the second current is a ground current for the card edge connector.

7. The apparatus of claim 1, wherein the card edge connector socket is a surface mount socket configured to be soldered to a printed circuit board, and wherein the second electrical contact provides the first current from a first surface mount pad of the printed circuit board.

8. The apparatus of claim 1, wherein the card edge connector socket is a plated through hole mount socket configured to be soldered to a printed circuit board, and wherein the second electrical contact provides the first current from a first plated through hole of the printed circuit board.

9. The apparatus of claim 1, wherein the card edge connector is a double data rate dual in-line memory module.

10. The apparatus of claim 1, wherein the card edge connector is a peripheral component interconnect-express device.

11. A method for installing a card edge connector to an information handling system, the method comprising:
providing, on the card edge connector, a contact array on a first edge of the card edge connector, and a first electrical contact on a second edge of the card edge connector, the first edge being perpendicular to the second edge;
providing, on a card edge connector socket configured to receive the card edge connector, a card-edge connector interface for receiving the card edge connector;
providing, on the card edge connector socket, a first slot channel for receiving the second edge of the card edge connector, the first slot channel including a second electrical contact configured such that, when the card edge connector is installed into the card edge connector socket, a first current is provided between the card edge connector socket and the card edge connector through the first electrical contact and the second electrical contact;
affixing the card edge connector socket to the information handling system; and
installing the card edge connector to the card edge connector socket.

12. The method of claim 11, wherein the first electrical contact is on a first surface of the card edge connector and the second electrical contact is on a first surface of the first slot channel, such that, when the card edge connector is installed into the card edge connector socket, the first surface of the card edge connector is adjacent to the first surface of the card edge connector socket.

13. The method of claim 12, further comprising:
providing, on the card edge connector, a third electrical contact; and
providing, on the card edge connector socket, a fourth electrical contact configured such that, when the card edge connector is installed into the card edge connector socket, a second current is provided between the card edge connector socket and the card edge connector through the third electrical contact and the fourth electrical contact.

14. The method of claim 13, wherein the third electrical contact is on the second edge of the card edge connector and on a second surface of the card edge connector, wherein the fourth electrical contact is on a second surface of the first slot channel, such that, when the card edge connector is installed into the card edge connector socket, the second surface of the card edge connector is adjacent to the second surface of the card edge connector socket.

15. The method of claim 13, wherein the third electrical contact is on a third edge of the card edge connector, and wherein the fourth electrical contact is included in a second slot channel of the card edge connector socket, the second slot channel for receiving the third edge of the card edge connector.

16. The method of claim 13, wherein the first current is a power current to provide power to the card edge connector, and wherein the second current is a ground current for the card edge connector.

17. The method of claim 11, wherein the card edge connector socket is a surface mount socket configured to be soldered to a printed circuit board, and wherein the second electrical contact provides the first current from a first surface mount pad of the printed circuit board.

18. The method of claim 11, wherein the card edge connector socket is a plated through hole mount socket configured to be soldered to a printed circuit board, and wherein the second electrical contact provides the first current from a first plated through hole of the printed circuit board.

19. The method of claim 11, wherein the card edge connector is one of a DDR DIMM and a PCIe device.

\* \* \* \* \*